(12) United States Patent  
Higashi

(10) Patent No.: US 7,957,115 B2  
(45) Date of Patent: Jun. 7, 2011

(54) DRIVE CIRCUIT OF VOLTAGE DRIVEN ELEMENT

(75) Inventor: Kazuyuki Higashi, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 473 days.

(21) Appl. No.: 12/119,520

(22) Filed: May 13, 2008

(65) Prior Publication Data

US 2008/0304197 A1 Dec. 11, 2008

(30) Foreign Application Priority Data

Jun. 6, 2007 (JP) ................................. 2007-150043

(51) Int. Cl.
*H02H 3/08* (2006.01)

(52) U.S. Cl. ........................ 361/93.7; 361/93.1; 327/480

(58) Field of Classification Search .................... 361/56, 361/93.1, 93.7; 327/427, 480

See application file for complete search history.

(56) References Cited

U.S. PATENT DOCUMENTS

| | | | |
|---|---|---|---|
| 5,091,664 A * | 2/1992 | Furuhata | 327/574 |
| 5,396,117 A * | 3/1995 | Housen et al. | 327/480 |
| 6,717,785 B2 * | 4/2004 | Fukuda et al. | 361/93.1 |
| 6,891,707 B2 | 5/2005 | Hiyama et al. | |
| 7,242,238 B2 * | 7/2007 | Higashi | 327/427 |
| 7,514,967 B2 * | 4/2009 | Higashi et al. | 327/108 |
| 7,737,737 B2 * | 6/2010 | Higashi et al. | 327/112 |

FOREIGN PATENT DOCUMENTS

JP 2002-353795 A 12/2002

* cited by examiner

*Primary Examiner* — Jared J Fureman
*Assistant Examiner* — Angela Brooks
(74) *Attorney, Agent, or Firm* — Young Basile

(57) ABSTRACT

A protection circuit is installed between a gate terminal (a control terminal) and an emitter terminal (a ground terminal) of a voltage driven element generally called a power device. The protection circuit is structured as a duplex protection system in which a first discharge circuit is configured to perform a discharge from the control terminal at a current value set in accordance with a current flowing between the load terminal and the ground terminal, an overcurrent generation detection device is configured to detect an existence of an overcurrent between the load terminal and the ground terminal, and a second discharge circuit is configured to perform the discharge from the control terminal at a predetermined constant current value after the overcurrent is detected.

10 Claims, 5 Drawing Sheets

US 7,957,115 B2

DRIVE CIRCUIT OF VOLTAGE DRIVEN ELEMENT

CROSS-REFERENCE TO RELATED APPLICATION

This application claims priority from Japanese Patent Application Serial No. 2007-150043, filed Jun. 6, 2007, which is incorporated herein in its entirety by reference.

TECHNICAL FIELD

The present invention relates to a protection circuit of a voltage driven element generally called a power device such as an IGBT (Insulated Gate Bipolar Transistor) or a power MOSFET.

BACKGROUND

In a voltage driven (switching) element generally called a power device such as an IGBT or a power MOSFET failures can be caused by a short-circuit or so forth generated between a collector of the voltage driven element and an emitter thereof or, more specifically, a short-circuit generated in a load such as a motor connected between the collector and the emitter. Such a short-circuit causes an excessive current or an overcurrent to flow between terminals of the collector of the voltage driven element and the emitter thereof (or between a source of the voltage driven element and a drain thereof). This overcurrent can influence the life of the element. Accordingly, a protection circuit to protect the power device from such overcurrents is generally installed in a control circuit of such as a power inverter in which the load is driven using power devices.

Japanese Patent Application Publication (tokkai) No. 2002-353795 exemplifies a protection circuit of a voltage driven element in which a discharge from a gate electrode terminal of the voltage driven element is performed at a discharge current value proportional to a sensed current value proportional to conduction current flowing between the collector terminal of the voltage driven element and the emitter terminal. Thereby, the protection circuit prevents overcurrents due to a short-circuit failure or so forth generated in a collector circuit of the voltage driven element.

BRIEF SUMMARY

Embodiments of a drive circuit of a voltage driven element including a control terminal, a load terminal and a ground terminal, are taught herein. One drive circuit comprises, for example, a first discharge circuit configured to perform a discharge from the control terminal at a current value set in accordance with a current flowing between the load terminal and the ground terminal. An overcurrent generation detection device is configured to detect an existence of an overcurrent between the load terminal and the ground terminal. In addition, a second discharge circuit is configured to perform the discharge from the control terminal at a predetermined constant current value after the overcurrent is detected.

This embodiment and others are described hereinafter.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

In the above-described protection circuit of Japanese Patent Application Publication (tokkai) No. 2002-353795, a ratio of the discharge current magnitude from the gate terminal of the voltage driven element to the current magnitude at the sense terminal of the voltage driven element is defined as a gain of the protection circuit. If the gain is large, a collector current during the short-circuit failure (hereinafter called a short-circuit current) oscillates, an amplitude of a collector-emitter voltage becomes large. Accordingly, there is a possibility of the collector-emitter voltage deteriorating and reducing the life of the voltage driven element. On the other hand, if the gain is small, a quick suppression of the short-circuit current cannot be made. This delay in the suppression of the short-circuit current may also deteriorate and reduce the life of the voltage driven element.

In other words, such as circuit is structured so that the magnitude of the gate discharge current is controlled in accordance with the current value flowing through the sense terminal of the voltage driven element. Hence, if the gain is made large, the short-circuit current oscillates, the amplitude of the collector-and-emitter voltage becomes large, and there is a possibility of deteriorating and reducing the life of the voltage driven element. If the gain is small, the delay in the suppression of the short-circuit current occurs. A large short-circuit current flows temporarily during the delay, which may also deteriorate and reduce the life of the element.

Figure 3A:
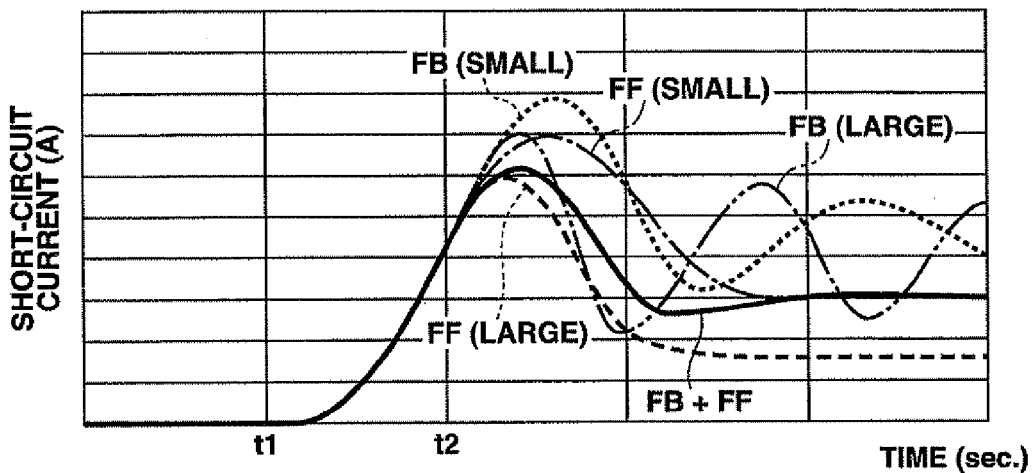
FIGS. 3A, 3B and 3C are waveform charts for explaining a short-circuit current suppression effect in a case where first and second discharge circuits are used together against a case where each of the first and second discharge circuits is used separately.
Figure 3B:
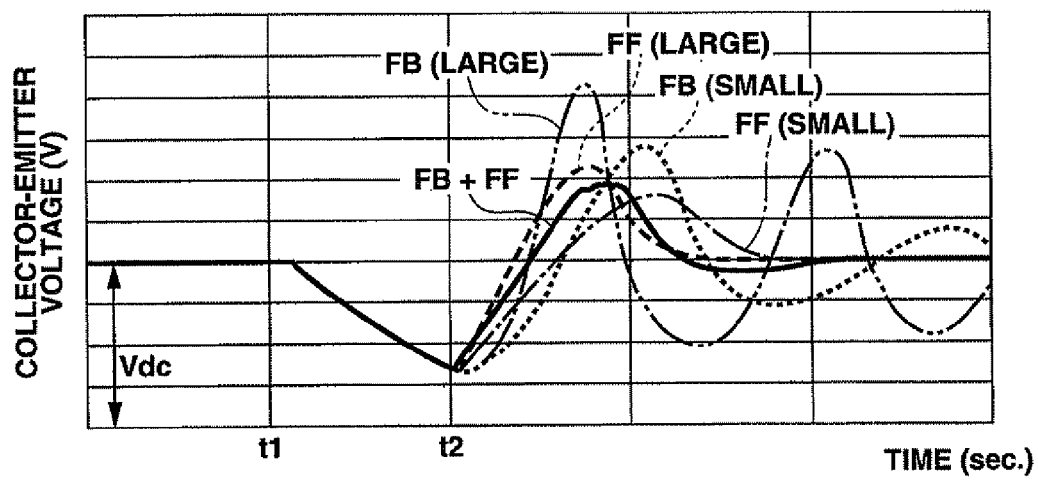
Figure 3C:
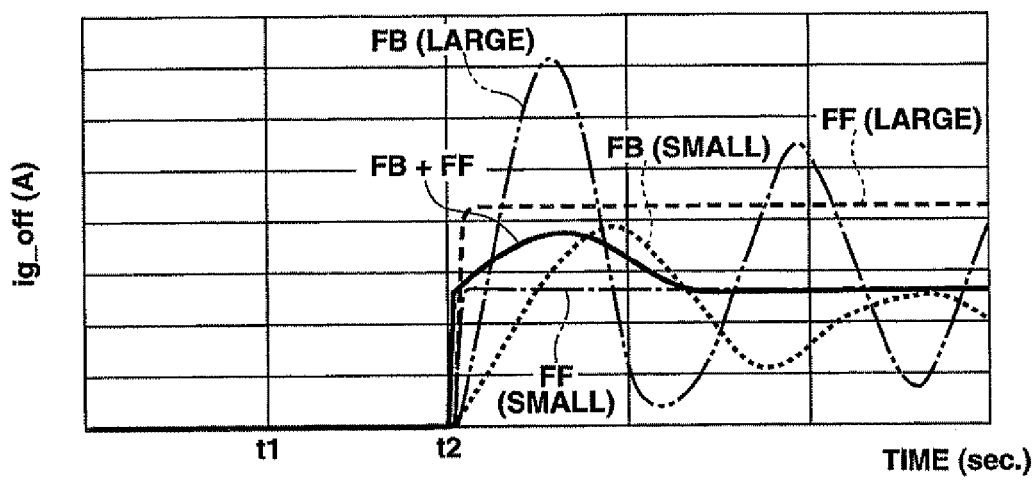
Figure 4A:
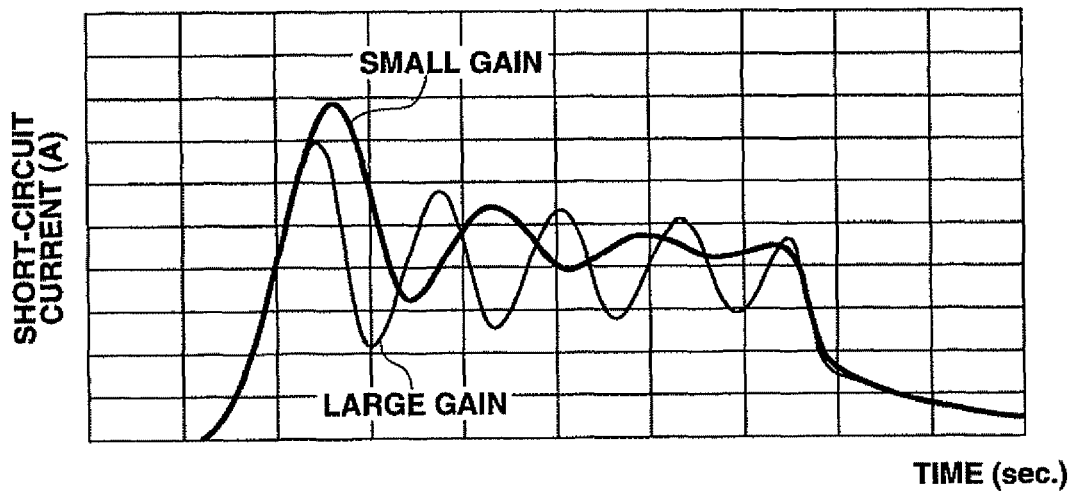
FIGS. 4A and 4B are waveform charts for explaining an operation of a known protection circuit of the voltage driven element.
Figure 4B:
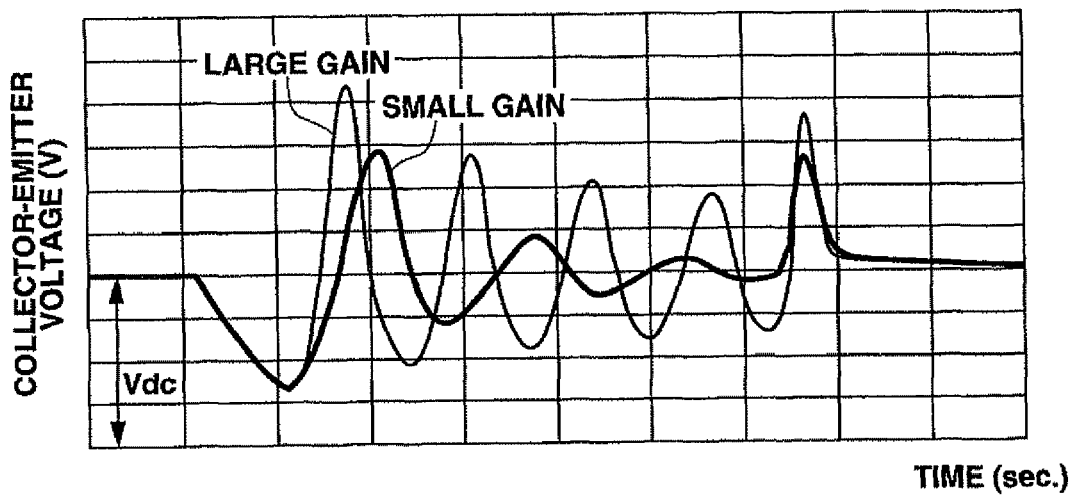

Waveforms of a short-circuit current (a collector current of the voltage driven element) according to a magnitude of the gain (namely, the ratio of the gate discharge current quantity to the sense terminal current quantity) and of variations of a collector-and-emitter voltage of the voltage driven element on a time axis according to the magnitude of the gain in the protection circuit are described with reference to FIGS. 4A and 4B. FIG. 4A shows a gain dependency of the short-circuit current waveforms, and FIG. 4B shows the gain dependency of the collector-and-emitter voltage variation waveforms. Note also that phases of the time axis between FIGS. 4A and 4B are aligned together. Hereinafter, the same relationships of FIGS. 4A and 4B are applied to FIGS. 2A, 2B, and 2C, and FIGS. 3A, 3B, and 3C. It will be appreciated from FIGS. 4A and 4B that, if the gain of the protection circuit is made large, the short-circuit current oscillates with a higher frequency, and variations in the amplitudes of the short-circuit current become large. At the same time, it will be appreciated from FIG. 4B that peak values of the collector-emitter voltage generated when the short-circuit current is reduced become large. In addition, when the gain of the protection circuit is made small, the amplitudes of the oscillations of the short-circuit current waveform become small over time. However, the delay in the suppression of the short-circuit current occurs, and, as a result, peak values of the short-circuit current immediately after the generation of the short-circuit are temporarily increased.

In contrast to the foregoing, embodiments of the invention taught herein provide a drive circuit of the voltage driven element having a protection circuit that is capable of suppressing oscillations of the short-circuit current where the gain is large and to quickly suppress the short-circuit current where the gain is small.

Figure 1:
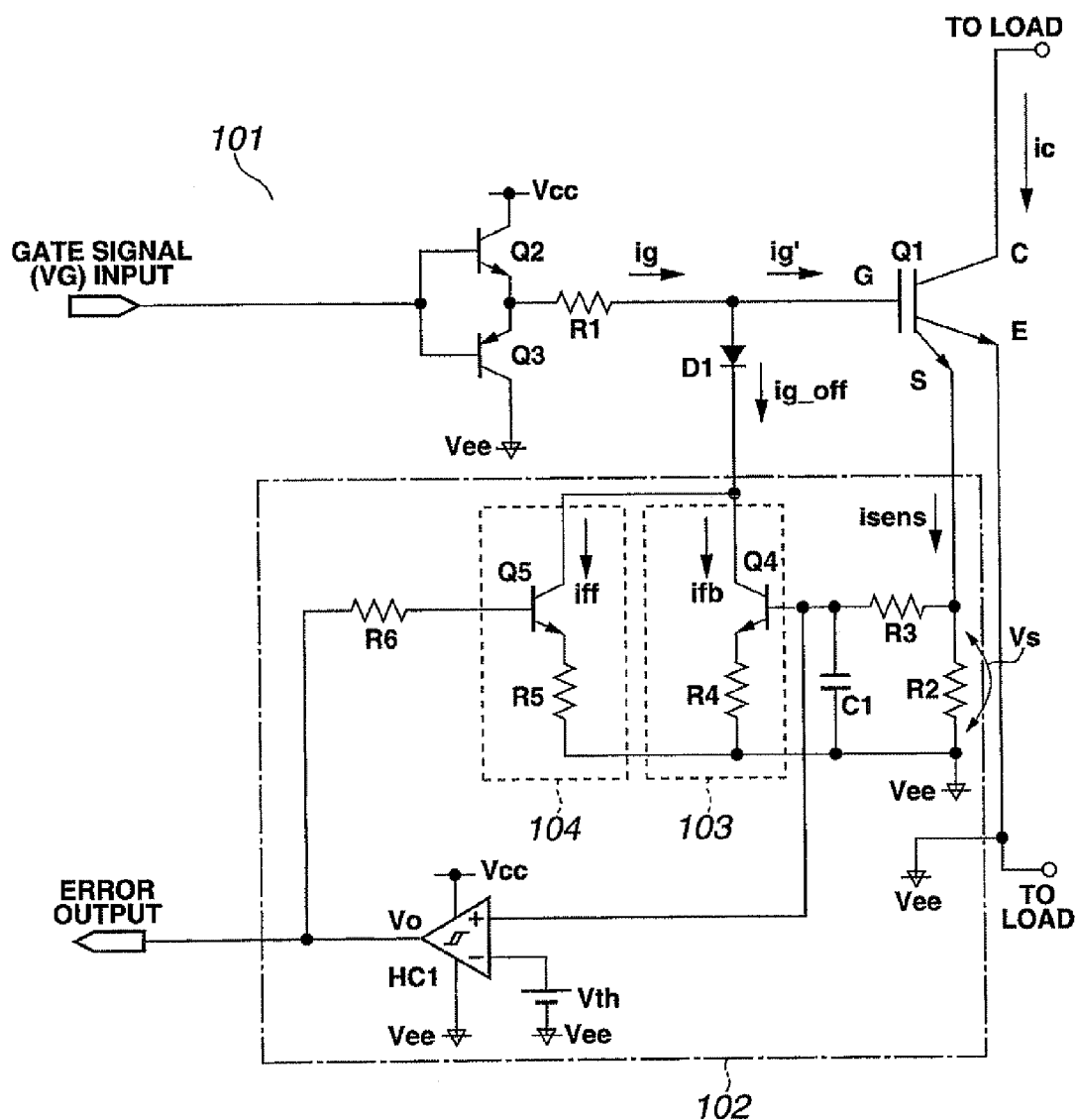
FIG. 1 is a circuit diagram of a protection circuit of a voltage driven element according to an embodiment of the invention.

FIG. 1 shows an embodiment of a gate drive circuit 101 (hereinafter, abbreviated as a drive circuit) using an IGBT as voltage driven (switching) element Q1. A gate terminal G (a control terminal) of IGBT Q1 is connected to a power supply voltage Vcc via a resistor R1 and a npn transistor Q2. A connection point between resistor R1 and npn transistor Q2 is connected to a reference potential Vee via a pnp transistor Q3. Base terminals of npn transistor Q2 and pnp transistor Q3 are connected to a gate signal input terminal VG to control npn transistor Q2 and pnp transistor Q3 to permit IGBT Q1 to perform gate charge-and-discharge operations at the gate terminal G of IGBT Q1. Reference potential Vee is the same potential as that of an emitter terminal E of IGBT Q1 and is also a reference potential of whole drive circuit 101. This reference potential Vee is preferably less than power supply voltage Vcc, and although reference potential Vee can be a minute potential, reference potential Vee is, in general, the ground potential.

Drive circuit 101 is provided with a short-circuit protection circuit 102 including first and second discharge circuits 103 and 104 installed between gate terminal G and emitter terminal (ground terminal) E of IGBT Q1 to suppress a short-circuit current and to protect IGBT Q1 from deterioration by performing gate discharge (that is, discharge from gate terminal G) when short-circuit current conducts to flow through IGBT Q1.

In short-circuit protection circuit 102, a voltage (hereinafter referred to as a short-circuit detection voltage Vs) is generated when a current isens from a sense terminal S of IGBT Q1 flows through a shunt resistor R2. Accordingly, the shunt resistor R2 serves to convert the current value into a proportional voltage value. Noise components of short-circuit detection voltage Vs are eliminated via a low-pass filter including a resistor R3 and a capacitor C1 at an input of first discharge circuit 103. In first discharge circuit 103, one end of resistor R3 is connected to a base terminal of npn transistor Q4, and an emitter terminal of npn transistor Q4 is connected to reference potential Vee via a resistor R4. That is, first discharge circuit 103 includes a npn transistor Q4 having a collector terminal connected to gate terminal G of IGBT Q1 via a rectifying diode D1, an emitter terminal connected to reference potential Vee and a base terminal receiving the voltage Vs generated across shunt resistor R2 via the low-pass filter formed by resistor R3 and capacitor C1.

Short-circuit detection voltage Vs generated across shunt resistor R2 and filtered by the low pass filter formed by resistor R3 and capacitor C1 is input to a positive input terminal of a hysteresis comparator HC1, which is a voltage comparator. A predetermined reference voltage Vth is applied to a negative input terminal of hysteresis comparator HC1. An output terminal of hysteresis comparator HC1 is connected to a base terminal of a npn transistor Q5 via a current limiting resistor R6 to enable IGBT Q1 to discharge the gate terminal G at a predetermined rate without depending upon the magnitude of short-circuit detection voltage Vs. The emitter terminal of npn transistor Q5 is connected to reference potential Vee via a resistor R5. Thus, a constant discharge current iff not depending upon collector current ic is generated. The second discharge circuit 104 thus includes npn transistor Q5 having a collector terminal connected to gate terminal G of IGBT Q1, an emitter terminal connected to the reference potential Vee and a base terminal connected to the output terminal of hysterisis comparator HC1.

In addition, the output terminal of hysteresis comparator HC1 is connected to an error output terminal through which an error signal can to be output to an external controller. It should be noted that short-circuit protection circuit 102 is connected to reference potential Vee, toward a direction of the ground potential from the gate terminal of IGBT Q1 via rectifying diode D1. It should also be noted that above-described reference potential Vee may be a potential at which the discharge from gate terminal G1 of IGBT Q1 is possible via npn transistors Q4 and Q5. Hence, as mentioned above, reference potential Vee may be a minute potential, but reference potential Vee, in general, is the ground potential.

Figure 2A:
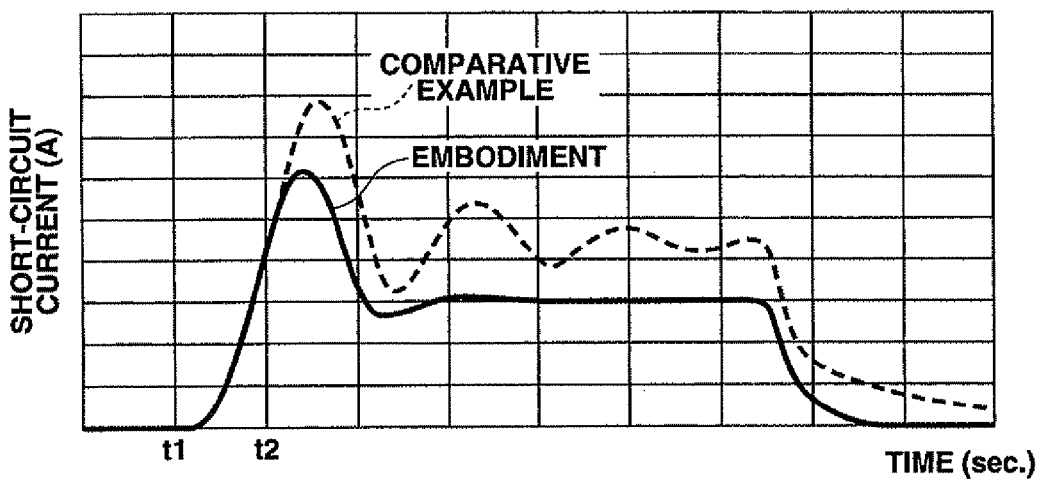
FIGS. 2A, 2B and 2C are waveform charts for explaining a short-circuit protection operation for the voltage driven element.
Figure 2B:
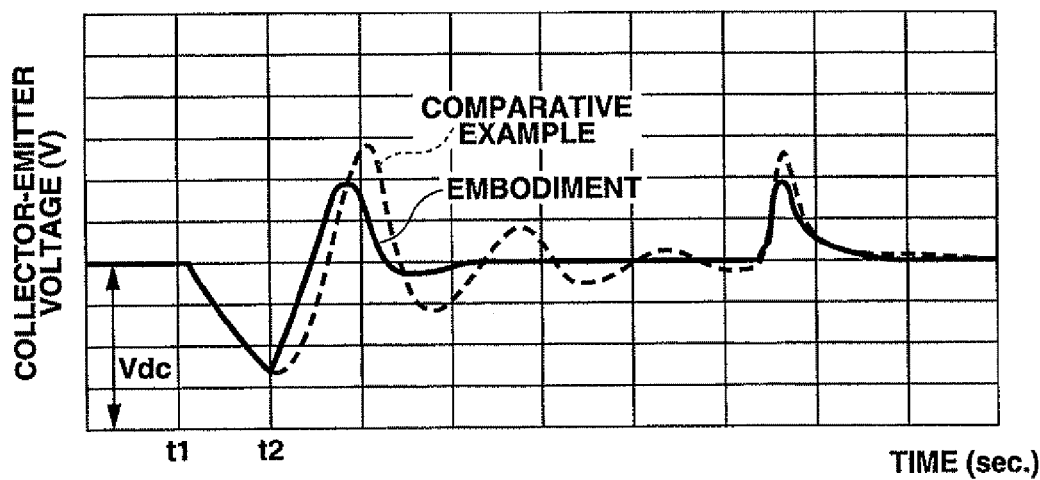
Figure 2C:
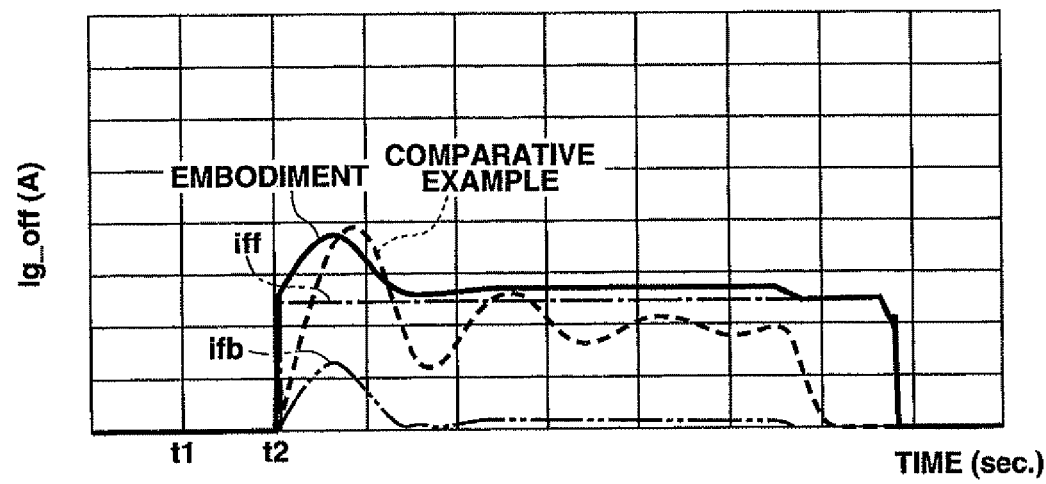

The short-circuit protection operation in the circuit shown in FIG. 1 is described below with reference to FIGS. 2A, 2B and 2C. The ordinate in FIG. 2A denotes the short-circuit current ic passing through IGBT Q1; the ordinate in FIG. 2B denotes the collector-emitter voltage of IGBT Q1; and the ordinate of FIG. 2C denotes a protection circuit current ig_off as shown in FIG. 1. The abscissa of each of FIGS. 2A, 2B and 2C is a time axis. The waveform denoted by a broken line in each of FIGS. 2A, 2B and 2C indicates the waveform in the case of a comparative example, namely the protection circuit described with respect to FIGS. 4A and 4B. Vdc shown in FIGS. 2B, 3B and 4B denotes the collector-emitter voltage before the overcurrent flows through IGBT Q1.

At a time t1 at which the short-circuit in the load circuit of IGBT Q1 is generated and the short-circuit current ic starts to rise, sense terminal current isens flows into shunt resistor R2 at a predetermined rate corresponding to the rise in the short-circuit current ic. At this time t1, short-circuit detection voltage Vs generated across shunt resistor R2 is applied to the base terminal of transistor Q4 in first discharge circuit 103 via the low-pass filter including resistor R3 and capacitor C1. Transistor Q4 performs a discharge operation through resistor R4 connected to its emitter terminal such that a discharge current ifb flows therethrough, with short-circuit detection voltage Vs as the control voltage. A relationship between current ifb generated and flowing through transistor Q4 and the short-circuit current ic is expressed in the following equation (1):

$$ifb = \frac{R2}{R4} \times \frac{ic}{\alpha}; \text{wherein} \quad (1)$$

α is a constant that denotes a ratio between collector (short-circuit) current ic and sense terminal current isens and α>1. That is, equation (1) represents that a current value (ifb) from first discharge circuit 103 is proportional to the short-circuit current ic. The current gain is determined according to a ratio between shunt resistor R2 and resistor R4.

On the other hand, short-circuit detection voltage Vs generated across shunt resistor R2 is input to the positive input terminal of hysterisis comparator HC1 via the low-pass filter of capacitor C1 and resistor R3. In addition, the negative input terminal of hysteresis comparator HC1 is connected to predetermined threshold voltage Vth. At a time t2 at which the voltage at the positive input terminal of hysteresis comparator HC1 is varied from less than predetermined threshold voltage Vth to greater than predetermined threshold voltage Vth, the output voltage Vo of hysteresis comparator HC1 is transferred from a low level to a high level. This transferred output voltage Vo of hysteresis comparator HC1 is input to the base terminal of npn transistor Q5 in second discharge circuit 104 via current limiting resistor R6. Npn transistor Q5 performs the discharge operation thereof through resistor R5 connected to its emitter terminal and performs a constant current operation with output voltage Vo of hysteresis comparator HC1 as a control voltage. A constant current iff generated at npn transistor Q5 can be expressed in the following equation (2):

$$iff = \frac{Vo}{R5}. \quad (2)$$

It will be appreciated from equation (2) that constant current iff from second discharge circuit 104 is not dependent on the short-circuit current ic but is determined according to output voltage Vo of hysteresis comparator HC1 and resistor R5. Thus, a charge current ig' to gate terminal G of IGBT Q1 after the short-circuit is generated can be expressed in the following equation (3):

$$ig' = ig - ig\_off; \text{ wherein} \quad (3)$$
$$ig = \frac{(VG1 - Vb2e2 - Vg1e1)}{R1};$$
$$ig\_off = ifb + iff;$$

VG1 denotes a gate signal input voltage of IGBT Q1; Vb2e2 denotes a base-emitter voltage of transistor Q2; and Vg1e1 denotes a gate-emitter voltage of IGBT Q1. It will be appreciated from equation (3) that the gate charge current ig' is suppressed by the gate discharge current ig_off.

In FIGS. 2A through 2C, discharge current ifb increases along with the increase in the short-circuit current ic after the short-circuit failure in the load circuit of IGBT Q1 is detected at time t2. Constant discharge current iff not dependent on a magnitude of short-circuit current ic is also generated. Hence, discharge current ig_off in short-circuit protection circuit 102 rises more steeply than at least the rise of discharge current ifb in first discharge circuit 103 due to discharge current iff in second discharge circuit 104. Since this rise occurs immediately after the short-circuit is generated, this permits the suppression of peak values of the short-circuit current ic. After the peak value generation of short-circuit current ic, discharge current ifb in first discharge circuit 103 causes short-circuit current ic to moderately fall to permit the suppression of the level of the surge voltage generated between the collector terminal C and emitter terminal E of IGBT Q1. Furthermore, even after the time elapsed after time t2 and short-circuit current ic is decreased, the constant discharge current iff is generated in second discharge circuit 104. This permits the short-circuit current ic to be suppressed.

For comparison purposes, time variations of short-circuit current ic, the collector-emitter voltage of IGBT Q1 and ig_off current in a case where short-circuit protection is performed by only first discharge circuit 103 are overlapped in FIGS. 2A, 2B and 2C, respectively, as denoted by the broken lines. It will be appreciated from FIGS. 2A, 2B and 2C that, according to embodiments of the invention, the suppression of the peak values of the short-circuit current ic and the suppression of the surge voltage generated between the collector terminal C and the emitter terminal E of IGBT Q1 during the generation of the short-circuit can mutually independently be controlled.

Hereinafter, the short-circuit protection operation in a case where each of first discharge circuit 103 and second discharge circuit 104 is separately operated is described with reference to FIGS. 3A, 3B and 3C. In FIGS. 3A, 3B and 3C, symbols FB (large) and FB (small) denote cases where only first discharge circuit 103 is operated and where an operating quantity of the protection circuit, namely, discharge current quantity ifb differs between a large magnitude and a small magnitude, respectively. Symbols FF (large) and FF (small) in FIGS. 3A, 3B and 3C denote cases where only second discharge circuit 104 is operated and where discharge current quantity iff differs between the large magnitude and the small magnitude respectively. In addition, symbol FB+FF in FIGS. 3A, 3B and 3C denotes a case where first discharge circuit 103 and second discharge circuit 104 are simultaneously operated.

The operation of only first discharge circuit 103 and the increase in discharge current ifb cause the peak value of short-circuit current ic in the case of FB (large) in FIG. 3A to be more suppressed than that in the case of FB (small) in FIG. 3A. However, the collector-emitter voltage of IGBT Q1 is, as shown in FB (large) of FIG. 3B, greatly increased. In addition, in a case where discharge current ifb is made small, the suppression of the collector-emitter voltage of IGBT Q1 can be achieved as shown in FB (small) in FIG. 3B. However, as shown in the line of FB (small) in FIG. 3A, the peak values of short-circuit current ic are increased.

In addition, when only second discharge circuit 104 is operated and discharge current iff is made large, the peak values of short-circuit current ic are suppressed as shown in the line of FF (large) in FIG. 3A, but the collector-emitter voltage of IGBT Q1 is not sufficiently suppressed as shown in the line of FF (large) in FIG. 3B. In addition, in a case where discharge current iff is made small, the collector-emitter voltage of IGBT Q1 is lowered as shown in the line of FF (small) in FIG. 3B, but the short-circuit current ic remains largely unsuppressed as shown in the line of FF (small) in FIG. 3A.

As described above, it is difficult to simultaneously suppress both the short-circuit current ic and the surge voltage between the collector terminal and the emitter terminal of IGBT Q1 using either one of first discharge circuit 103 and second discharge circuit 104. In order to concurrently address these current and voltage suppressions, as shown by lines FB+FF in FIGS. 3A, 3B and 3C, it is more effective that the rise in the discharge current corresponding to ig_off be steeper than at least the rise in the discharge current ifb of first discharge circuit 103, and, thereafter, the discharge current be increased or decreased in proportion to the short-circuit current ic.

It should be noted that although IGBT Q1 is used as the voltage driven element and the bipolar transistors are used as discharging devices, the invention is not limited to this combination. For example, the invention could be implemented by the use of FETs or other active elements as the switching elements.

Figure 5:
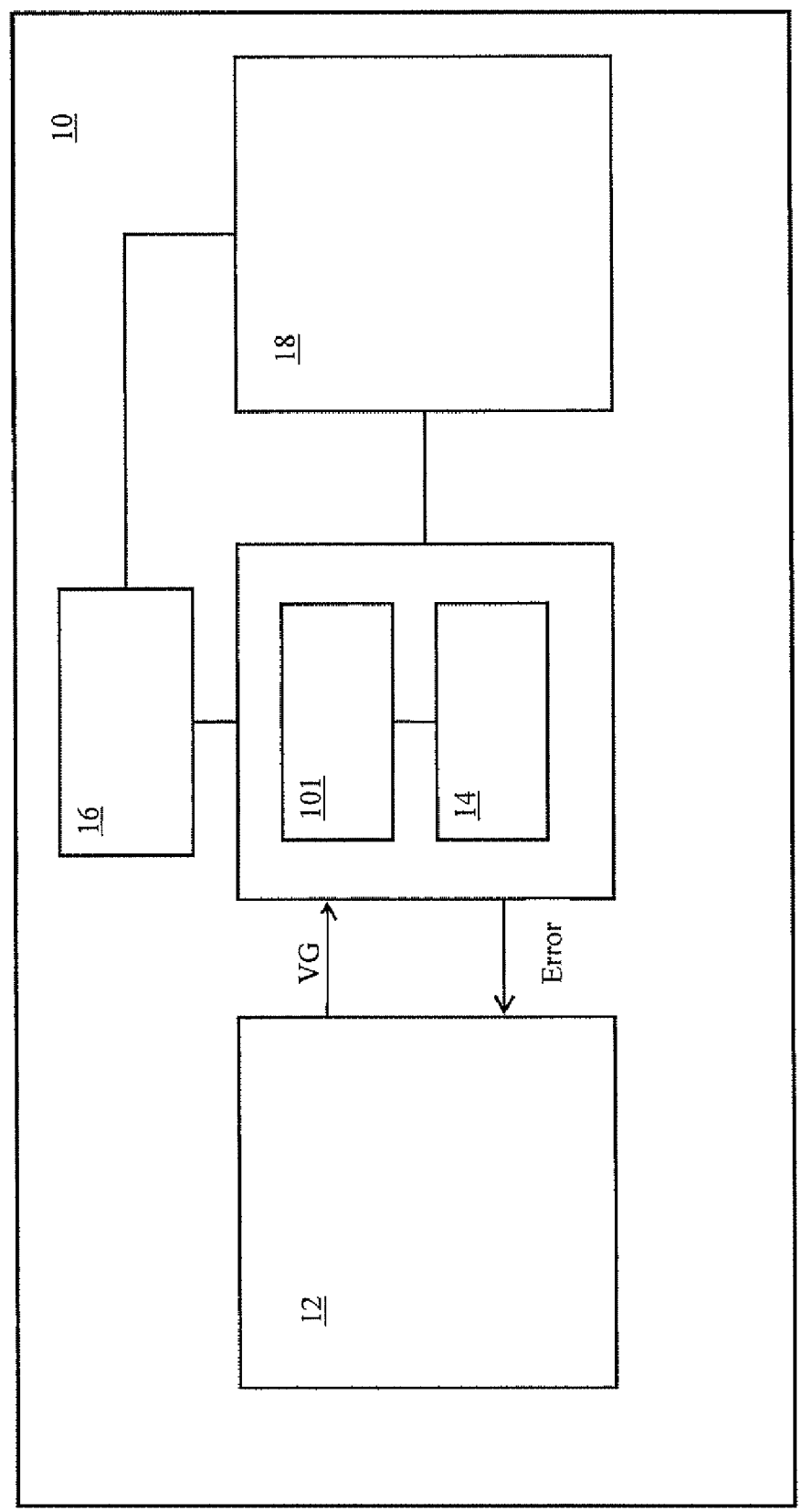
FIG. 5 is a simplified schematic diagram of a vehicle incorporating an inverter protected by the protection circuit according to FIG. 1.

One application of embodiments of the invention is in an electric (EV) or hybrid electric (HEV) vehicle. Such a vehicle 10 is shown by example in FIG. 5. The vehicle 10 incorporates a controller 12 to provide switching signals to a gate drive circuit 101. Switching element IGBT Q1 is one of a plurality of power switching devices of an inverter 14. A battery 16 is coupled to the inverter 14 and gate drive circuit 101 to supply a motor 18 based on switching signals, such as gate signal VG from the controller 12. Although only one gate drive circuit 101 is shown, each power switching device of inverter 14 includes its own protection in the form of first discharge circuit 103 and second discharge circuit 104.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A drive circuit of a voltage driven element including a control terminal, a load terminal and a ground terminal, the drive circuit comprising:
    a first discharge circuit configured to perform a discharge from the control terminal at a current value set in accordance with a current flowing between the load terminal and the ground terminal;
    an overcurrent generation detection device configured to detect an existence of an overcurrent between the load terminal and the ground terminal; and
    a second discharge circuit configured to perform the discharge from the control terminal at a predetermined constant current value in response to detection of the overcurrent by the overcurrent generation detection device, wherein the first discharge circuit and the second discharge circuit operate in unison after the overcurrent is detected to perform the discharge from the control terminal at a gate discharge current equal to the sum of the current value of the first discharge circuit and the predetermined constant current value of the second discharge circuit.

2. The drive circuit according to claim 1 wherein the voltage driven element includes a sense terminal located such that a current having a predetermined ratio to the current flowing between the load electrode terminal and the ground electrode terminal flows therethrough.

3. The drive circuit according to claim 2 wherein the overcurrent generation detection device includes a shunt resistor connected to the sense terminal; and
    wherein the first discharge circuit includes: a first transistor having a load electrode terminal connected to the control terminal of the voltage driven element, a ground electrode terminal connected to a reference potential at a lower value than a potential of the control terminal of the voltage driven element, and a control electrode terminal connected such that a voltage generated across the shunt resistor is applied thereto.

4. The drive circuit according to claim 3 wherein the overcurrent generation detection device includes a voltage comparator, the voltage comparator configured to compare a voltage value generated across the shunt resistor with a predetermined reference voltage and to output a voltage value when the voltage value generated across the shunt resistor is equal to or higher than the predetermined reference voltage.

5. The drive circuit according to claim 4 wherein the second discharge circuit includes:
    a second transistor configured to be controllably turned on and off according to an output voltage from the voltage comparator, and the second transistor comprising:
        a load electrode terminal connected to the control terminal of the voltage driven element, a ground electrode terminal connected to a reference potential at a lower value than a potential of the control terminal of the voltage driven element, and a control electrode terminal connected to an output of the voltage comparator.

6. The drive circuit according to claim 5 wherein both the first transistor and the second transistor are npn transistors.

7. The drive circuit according to claim 4 wherein a first input terminal of the voltage comparator is configured to receive the voltage value generated across the shunt resistor via a low-pass filter and the control electrode terminal of the first transistor is configured to receive the voltage value generated across the shunt resistor via the low-pass filter; and
    wherein the second input terminal of the voltage comparator is configured to receive the predetermined reference voltage.

8. The drive circuit according to claim 1 wherein the second discharge circuit is configured to start the discharge on a rising edge steeper than at least a rise of the discharge of the first discharge circuit.

9. A drive circuit of a voltage driven element including a control terminal, a load terminal and a ground terminal, the drive circuit comprising:
    first means for discharging current from the control terminal at a current value set in accordance with a current flowing between the load terminal and the ground terminal;
    means for detecting an overcurrent generated between the load terminal and the ground terminal; and
    second means for starting a discharge of current on a rising edge steeper than at least a rise of a discharge of the first means and for discharging current from the control terminal at a predetermined constant current value in response to detection of the overcurrent by the detecting means, wherein the first means and the second means operate in unison after the overcurrent is detected to perform the discharge from the control terminal at a gate discharge current equal to the sum of the current value of the first means and the predetermined constant current value of the second means.

10. In a drive circuit for a voltage driven element including a control terminal, a load terminal and a ground terminal, the voltage driven element being a portion of an inverter for a motor and the drive circuit including a first discharge circuit discharging current from the control terminal at a current value set in accordance with a current flowing between the load terminal and the ground terminal, the improvement including:
    means for detecting an overcurrent generated between the load terminal and the ground terminal; and
    second means for discharging current from the control terminal at a predetermined constant current value in response to detection of the overcurrent by the detecting means, wherein the first discharge circuit and the second means operate in unison after the overcurrent is detected to perform the discharge from the control terminal at a gate discharge current equal to the sum of the current value of the first discharge circuit and the predetermined constant current value of the second means.

* * * * *